(12) United States Patent
Sun

(10) Patent No.: US 10,735,866 B2
(45) Date of Patent: Aug. 4, 2020

(54) MEMS MICROPHONE AND METHOD OF MANUFACTURING THE SAME

(71) Applicant: DB HITEK CO., LTD., Gangnam-gu, Seoul (KR)

(72) Inventor: Jong Won Sun, Icheon-si (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/127,857

(22) Filed: Sep. 11, 2018

(65) Prior Publication Data

US 2019/0082270 A1 Mar. 14, 2019

(30) Foreign Application Priority Data

Sep. 11, 2017 (KR) .................... 10-2017-0115694

(51) Int. Cl.
*H04R 19/04* (2006.01)
*B81B 3/00* (2006.01)
(Continued)

(52) U.S. Cl.
CPC ............. *H04R 19/04* (2013.01); *B81B 3/007* (2013.01); *B81B 3/0021* (2013.01);
(Continued)

(58) Field of Classification Search
CPC .............. H04R 19/04; H04R 19/005; H04R 2201/003; H04R 31/00; H04R 31/003;
(Continued)

(56) References Cited

U.S. PATENT DOCUMENTS

| 6,535,460 B2 | 3/2003 | Loeppert et al. |
| 7,362,873 B2 | 4/2008 | Pedersen |

(Continued)

FOREIGN PATENT DOCUMENTS

| KR | 1020080052222 A | 6/2008 |
| KR | 1020100073051 A | 7/2010 |

(Continued)

OTHER PUBLICATIONS

Korean Office Action, Korean Application No. 10-2016-0050894, dated Feb. 22, 2018, 3 pages (7 pages with translation).

(Continued)

*Primary Examiner* — Fan S Tsang
*Assistant Examiner* — Julie X Dang
(74) *Attorney, Agent, or Firm* — Patterson Thuente Pedersen, P.A.

(57) ABSTRACT

A MEMS microphone includes a substrate having a cylindrical cavity, a back plate disposed over the substrate and having a plurality of acoustic holes defined therethrough, a diaphragm disposed between the substrate and the back plate, the diaphragm spaced apart from the substrate and the back plate, covering the cavity to form an air gap between the back plate, and being configured to generate a displacement with responding to an acoustic pressure and an anchor extending from an end portion of the diaphragm and extending along a circumference of the diaphragm, and the anchor including a lower surface in contact with an upper surface of the substrate to support the diaphragm, and a connecting portion, which is connected to the diaphragm, presenting a stepped cross section. Thus, the MEMS microphone may have improved flexibility and improved total harmonic distortion.

10 Claims, 9 Drawing Sheets

(51) Int. Cl.
*B81C 1/00* (2006.01)
*H04R 19/00* (2006.01)
*H04R 7/18* (2006.01)
*H04R 7/04* (2006.01)
*H04R 31/00* (2006.01)

(52) U.S. Cl.
CPC .......... *B81C 1/00476* (2013.01); *H04R 7/18* (2013.01); *H04R 19/005* (2013.01); *B81B 2201/0257* (2013.01); *B81B 2203/0127* (2013.01); *B81B 2203/0307* (2013.01); *B81C 2201/0109* (2013.01); *B81C 2201/0133* (2013.01); *H04R 7/04* (2013.01); *H04R 31/00* (2013.01); *H04R 2201/003* (2013.01)

(58) Field of Classification Search
CPC ... H04R 7/04; H04R 7/18; H04R 1/04; H04R 31/006; H04R 2410/03; H04R 2499/11; H04R 7/06; H04R 17/02; H04R 7/24; H04R 19/016; H04R 2307/207; H04R 3/005; H04R 7/16; H04R 7/20; H04R 17/00; H04R 19/00; H04R 19/02; H04R 1/025; H04R 1/06; H04R 1/08; H04R 1/2807; H04R 1/2876; H04R 1/342; B81B 3/0072; B81B 3/0021; B81B 3/001; B81B 3/007; B81B 7/0061; B81B 3/0078; B81B 2203/0118; B81B 7/02; B81B 2203/0163; B81B 2207/012; B81B 2207/07; B81B 2201/0242; B81B 2203/0361; B81B 2207/115; B81B 3/0037; B81B 3/0051; B81B 3/0059; B81B 3/0094; B81B 7/007; B81B 2201/0214; B81B 2201/0292; B81B 2201/047; B81B 2203/0136
USPC ....... 381/175, 176, 174, 181, 190, 191, 178; 367/170, 178, 163, 174
See application file for complete search history.

(56) References Cited

U.S. PATENT DOCUMENTS

| | | |
|---|---|---|
| 8,942,394 B2 | 1/2015 | Conti et al. |
| 2006/0233401 A1* | 10/2006 | Wang .................. B81B 3/0072 381/176 |
| 2007/0134839 A1 | 6/2007 | Chang et al. |
| 2010/0158279 A1* | 6/2010 | Conti ...................... H04R 7/24 381/174 |
| 2011/0140215 A1 | 6/2011 | Sato |
| 2011/0227177 A1 | 9/2011 | Nakatani et al. |
| 2014/0374859 A1 | 12/2014 | Kasai |
| 2015/0375991 A1* | 12/2015 | Schelling ............. B81B 3/0072 257/416 |
| 2016/0145095 A1* | 5/2016 | Tsai ...................... B81B 7/0048 257/415 |
| 2016/0362292 A1 | 12/2016 | Chang |
| 2017/0212070 A1 | 7/2017 | Lee et al. |
| 2017/0234821 A1 | 8/2017 | Lee et al. |
| 2017/0311083 A1 | 10/2017 | Sun et al. |
| 2017/0311088 A1 | 10/2017 | Sun et al. |
| 2017/0311089 A1 | 10/2017 | Sun et al. |
| 2017/0359648 A1 | 12/2017 | Park et al. |

FOREIGN PATENT DOCUMENTS

| | | |
|---|---|---|
| KR | 101462375 B1 | 11/2014 |
| KR | 101578542 B1 * | 12/2015 |
| KR | 101578542 B1 | 12/2015 |

OTHER PUBLICATIONS

Korean Final Office Action, Korean Application No. 10-2016-0050894, dated Jun. 26, 2018, 4 pages (7 pages with translation).
U.S. Appl. No. 15/497,366, filed Apr. 26, 2017, Inventor(s): Sun et al.
U.S. Appl. No. 16/056,840, filed Aug. 7, 2018, Inventor(s): Park et al.
U.S. Appl. No. 16/056,863, filed Aug. 7, 2018, Inventor(s): Sun.
U.S. Appl. No. 16/127,897, filed Sep. 11, 2018, Inventor(s): Kim et al.
U.S. Appl. No. 16/127,693, filed Sep. 11, 2018, Inventor(s): Sun.

* cited by examiner

MEMS MICROPHONE AND METHOD OF MANUFACTURING THE SAME

CROSS-REFERENCE TO RELATED APPLICATION

This application claims priority to Korean Patent Application No. 10-2017-0115694, filed on Sep. 11, 2017 and all the benefits accruing therefrom under 35 U.S.C. § 119, the contents of which are incorporated by reference in their entirety.

TECHNICAL FIELD

The present disclosure relates to Micro-Electro-Mechanical Systems (MEMS) microphones capable of converting an acoustic wave into an electrical signal, and a method of manufacturing such MEMS microphones, and more particularly, to capacitive MEMS microphones that are capable of transmitting signals related to an acoustic signal using a displacement which may be generated due to an acoustic pressure and a method of manufacturing such MEMS microphones.

BACKGROUND

Generally, a capacitive microphone utilizes a capacitance between a pair of electrodes which are facing each other to generate an acoustic signal. A MEMS microphone may be manufactured by a semiconductor MEMS process to have an ultra-small size.

A MEMS microphone may include a substrate including a cavity, a bendable diaphragm and a back plate which is facing the diaphragm. The diaphragm can be a membrane structure to generate a displacement due to the acoustic pressure. In particular, when the acoustic pressure reaches to the diaphragm, the diaphragm may be bent upwardly or downwardly due to the acoustic pressure. The displacement of the diaphragm can be sensed through a change of capacitance between the diaphragm and the back plate. As a result, an acoustic wave can be converted into an electrical signal for output.

The characteristics of a MEMS microphone can be determined by measuring various factors such as: a pull-in voltage, sensitivity, a frequency resonance, and a total harmonic distortion (THD). In particular, a THD value may serve as an indicator for or symptom of unnecessary harmonic components in the acoustic signal to result in distortion. The distortion component is a component tone which is not originally included in the input acoustic signal, which may cause sound quality to degrade upon reproduction. Therefore, a MEMS microphone should ideally be configured such that the THD value does not exceed a proper level. It can be especially important to maintain an appropriate level of the THD value in cases where the flexibility of the diaphragm is low.

SUMMARY

The embodiments of the present invention provide a MEMS microphone capable of decreasing a THD phenomenon, and a method of manufacturing the MEMS microphone.

According to an example embodiment of the present invention, a MEMS microphone includes a substrate defining a cylindrical, a back plate disposed over the substrate and defining a plurality of acoustic holes, a diaphragm disposed between the substrate and the back plate, the diaphragm being spaced apart from the substrate and the back plate, covering the cavity such that an air gap is between the back plate and the diaphragm, and configured to generate a displacement corresponding to an acoustic pressure. An anchor extending from an end portion of the diaphragm and extending along a circumference of the diaphragm includes a lower surface in contact with an upper surface of the substrate to support the diaphragm, and a connecting portion coupled to the diaphragm, the connecting portion presenting a stepped cross section.

In an example embodiment, the anchor may present a ring shape to surround the cavity, that is, having an inner perimeter later than the perimeter of the cavity.

In an example embodiment, the diaphragm may define a plurality of vent holes penetrating therethrough. The vent holes may be radially spaced proximate the connecting portion of the anchor, and within the inner diameter of the anchor. In an example embodiment, the anchor may include a bottom portion in contact with an upper surface of the substrate, the bottom portion presenting a ring shape having an inner diameter larger than the diameter of the cylindrical cavity and comprising the lower surface, a first side portion extending from the inner circumference of the bottom portion toward the back plate, the first side portion being connected to the diaphragm and having a stepped shape, and a second side portion extending the bottom portion toward the back plate, the second side portion facing the first side portion. The first side portion may present a ring shape.

In an example embodiment, the MEMS microphone may further include an upper insulation layer covering the back plate and holding the back plate to space the back plate from the diaphragm such that the air gap is maintained, and a strut provided at an outer side of the anchor and having a lower surface in contact with the upper surface of the substrate to support the upper insulation layer away from the substrate such that the upper insulation layer is spaced apart from the diaphragm.

According to an example embodiment of the present invention, a MEMS microphone includes a substrate presenting into a vibration area, a supporting area surrounding the vibration area and a peripheral area surrounding the supporting area, the substrate having a cylindrical cavity formed in the vibration area, a diaphragm disposed over the substrate to cover the cavity, the diaphragm being spaced apart from the substrate, and being configured to generate a displacement corresponding to an applied acoustic pressure, a back plate disposed over the diaphragm and in the vibration area, the back plate being spaced apart from the diaphragm to form an air gap between the diaphragm and defining a plurality of acoustic holes, and an anchor extending from an end portion of the diaphragm toward the substrate in the supporting area and extending along a circumference of the diaphragm to be configured to support the diaphragm, and the having a stepped structure.

In an example embodiment, the anchor may present a ring shape surrounding the vibration area. In an example embodiment, the diaphragm may include a plurality of vent holes penetrating through the diaphragm in the supporting area.

In an example embodiment, the anchor may include a bottom portion in contact with an upper surface of the substrate, the bottom portion presenting a ring shape having an inner diameter larger than the diameter of the cavity, and a first side portion extending from the bottom portion toward the back plate, the first side portion being connected to the diaphragm and presenting a stepped cross-section.

In an example embodiment, the MEMS microphone may further include an upper insulation layer covering the back plate and holding the back plate to space the back plate from the diaphragm such that the air gap is maintained, and a strut being provided at an outer side of the anchor and having a lower surface making contact with the upper surface of the substrate to support the upper insulation layer away from the substrate such that the upper insulation layer is spaced apart from the diaphragm.

According to an example embodiment of the present invention, a method of manufacturing comprises the following: a lower insulation layer is formed on a substrate having into a vibration area, a supporting area surrounding the vibration area, and a peripheral area surrounding the supporting area. A diaphragm and an anchor for supporting the diaphragm are formed on the lower insulation layer. A sacrificial layer is formed on the lower insulation layer to cover the diaphragm and the anchor. A back plate is formed on the sacrificial layer in the vibration area to face the diaphragm. The back plate is patterned to form a plurality of acoustic holes which penetrate through the back plate. The substrate is patterned to form a cavity in the vibration area to partially expose the lower insulation layer. Further, an etching process is performed whereby an etchant is passed through the cavity and the acoustic holes to remove portions of the sacrificial layer and the lower insulation layer, each of the removed portions located at positions corresponding the vibration area and the supporting area, wherein the anchor extends along a circumference of the diaphragm in h supporting area, and the anchor presents a stepped cross section.

In an example embodiment, forming the diaphragm and the anchor may include patterning the lower insulation layer to form an anchor channel in the supporting area for forming the anchor, forming a silicon layer on the lower insulation layer through which the anchor channel is formed, and patterning the silicon layer to form the diaphragm and the anchor, wherein the anchor channel presents a ring shape configured to surround the vibration area, and the anchor channel presents an inner side face presenting stepped cross section for forming the stepped cross section of the anchor.

In embodiments, forming the anchor channel may include forming the inner side face positioned to be adjacent to the vibration area.

In an example embodiment, forming the diaphragm and the anchor may include patterning the silicon layer to form a plurality of vent holes penetrating through the diaphragm simultaneously with the diaphragm and the anchor. The vent holes may provide passages for the etchant, during the etching process.

In an example embodiment, the method may further include forming an upper insulation layer on the sacrificial layer for holding the back plate to be spaced apart from the diaphragm, and forming a strut to space the upper insulation layer from the diaphragm, prior to forming the acoustic holes. Forming the acoustic holes may include patterning the back plate and the upper insulation layer such that the acoustic holes penetrate through the back plate and the upper insulation layer in the vibration area.

Forming the upper insulation layer and the strut may include patterning the sacrificial layer and the lower insulation layer to form a strut channel in the supporting area and along a periphery of the vibration area for forming the strut, forming an insulation layer on the sacrificial layer to form the upper insulation layer and the strut. The insulation layer may be made of a material different from those of the lower insulation layer and the sacrificial layer, and having an etching selectivity against the lower insulation layer and the sacrificial layer, such that the strut suppresses the flow of the etchant into the peripheral area while removing the portions of the lower insulation layer and the sacrificial layer in the vibration area and the supporting area. According to example embodiments of the present invention as described above, the MEMS microphone includes an anchor for supporting the diaphragm, and the anchor may be provided to have the stepped structure for being connected to the diaphragm. Accordingly, since the flexibility of the diaphragm can be remarkably improved compared to the conventional one, the total harmonic distortion of the MEMS microphone can be adjusted so as not to exceed an appropriate level, and the quality of the MEMS microphone may be improved.

Further, the anchor may be provided in a ring shape extending along the periphery of the diaphragm. Accordingly, in the manufacturing process of the MEMS microphone, the process margin can be secured as compared with the prior one, since the anchor may function to define the moving region of the etchant, and the lower insulation layer may be prevented from remaining on the inner periphery of the anchor. As a result, the MEMS microphone may prevent the buckling phenomenon of the diaphragm which might occur due to the residual insulation layer, such that the acoustic wave may smoothly move.

In addition, since the diaphragm has vent holes that can be provided as a passage of acoustic waves and an etchant, the acoustic waves may smoothly move and process efficiency may be improved.

BRIEF DESCRIPTION OF THE DRAWINGS

Example embodiments can be understood in more detail from the following description taken in conjunction with the accompanying drawings, in which.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. By contrast, it will also be understood that when a layer, a film, a region or a plate is referred to as being 'directly on' another one, it is directly on the other one, and one or more intervening layers, films, regions or plates do not exist. Also, although terms such as a first, a second, and a third are used to describe various components, compositions, regions, films, and layers in various embodiments of the present invention, such elements are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. The Figures are not necessarily drawn to scale. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 1:
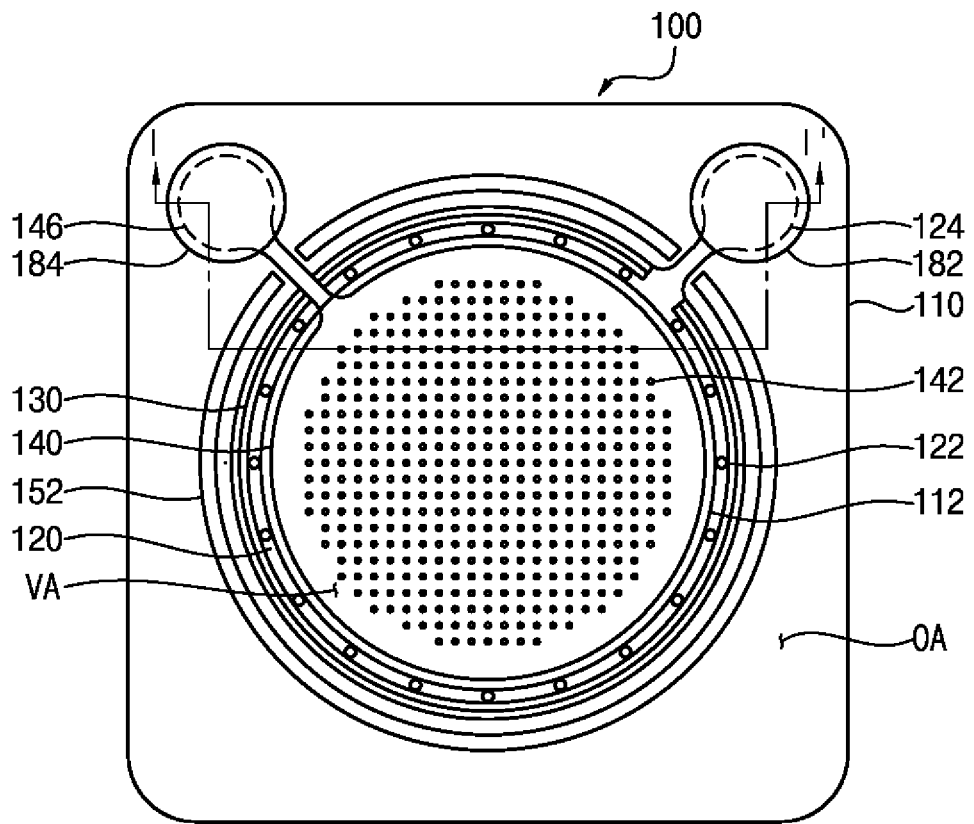
FIG. 1 is a plan view illustrating a MEMS microphone in accordance with an example embodiment of the present invention.
Figure 2:
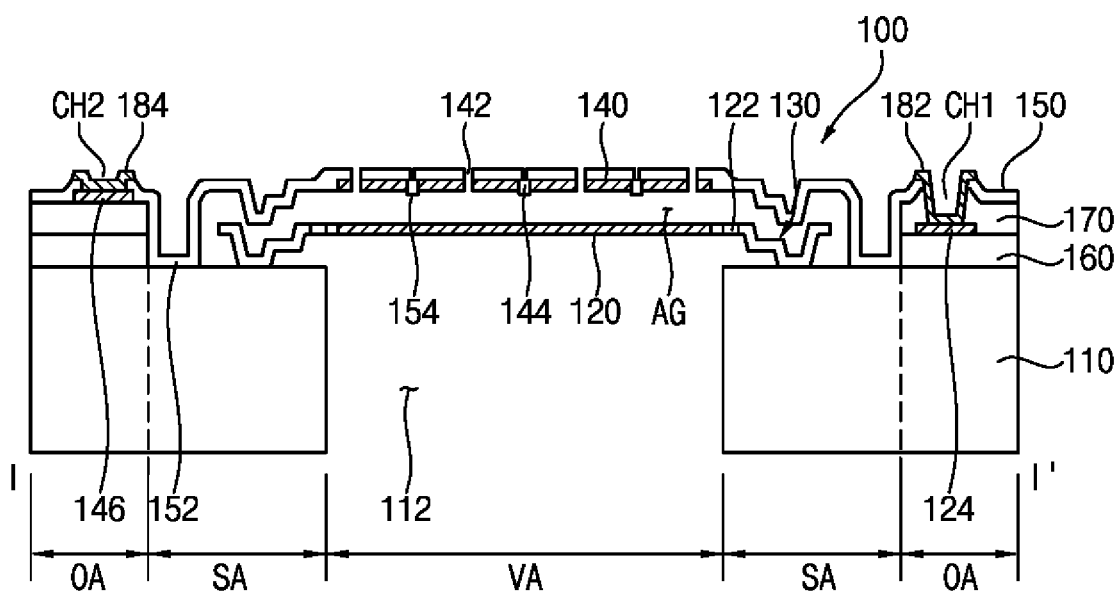
FIG. 2 is a cross sectional view taken along a line I-I' of FIG. 1.
Figure 3:
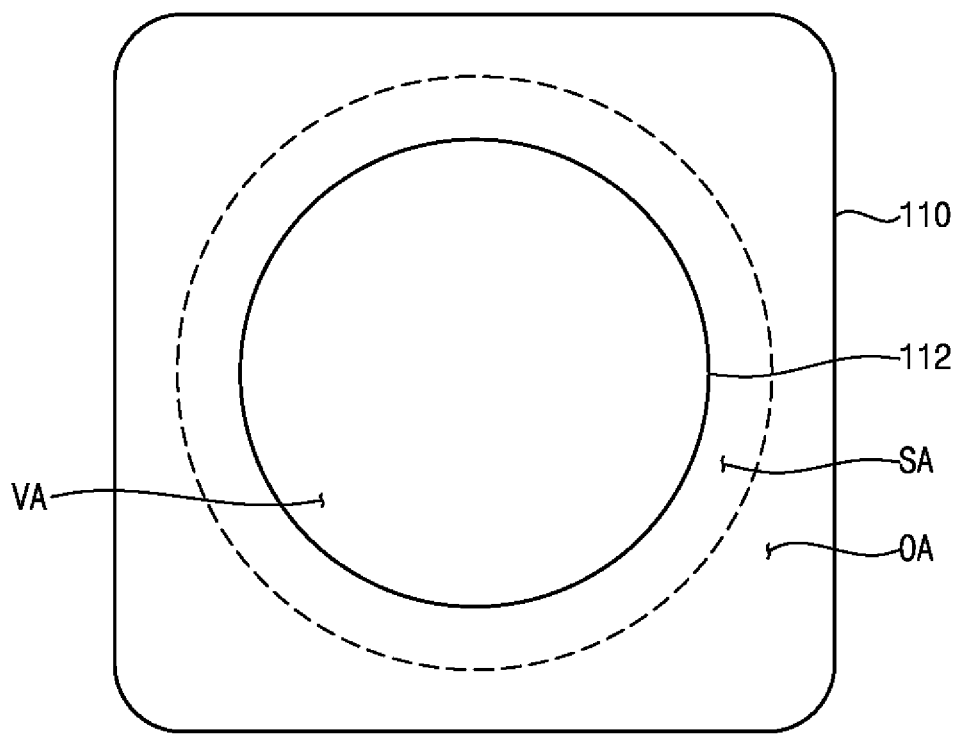
FIG. 3 is a plan view illustrating the substrate shown in FIG. 2.
Figure 4:
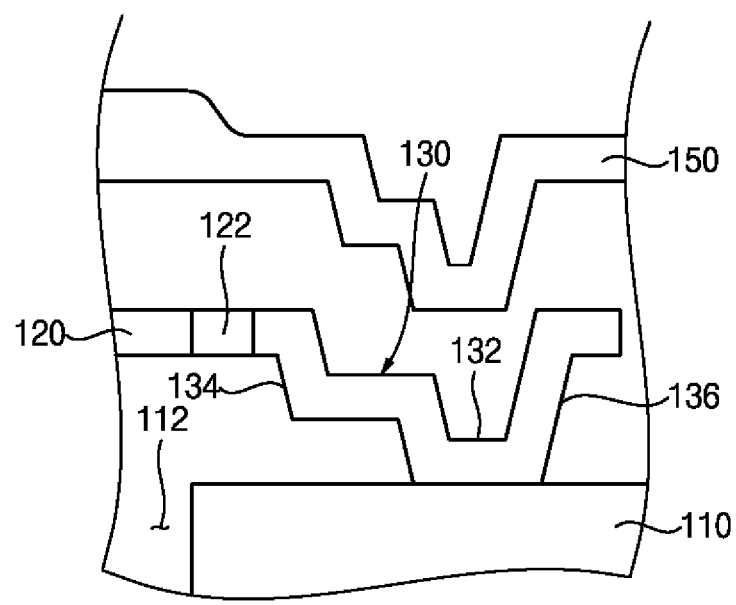
FIG. 4 is a cross sectional view illustrating a portion of the MEMS microphone of FIG. 2.

FIG. 1 is a plan view illustrating a MEMS microphone in accordance with an example embodiment of the present invention. FIG. 2 is a radial cross sectional view taken along a line I-I' of FIG. 1. FIG. 3 is a plan view illustrating the substrate shown in FIG. 2. FIG. 4 is a cross sectional view illustrating the anchor shown in FIG. 2.

Referring to FIGS. 1 to 3, a MEMS microphone 100 in accordance with an example embodiment of the present invention is capable of creating a displacement in response to an applied acoustic pressure to convert an acoustic wave into an electrical signal and output the electrical signal. The MEMS microphone 100 includes a substrate 110, a diaphragm 120, an anchor 130 and a back plate 140.

As shown in FIG. 3, the substrate 110 is divided into a vibration area VA, a supporting area SA surrounding the vibration area VA, and a peripheral area OA surrounding the supporting area SA. In the vibration area VA of the substrate 110, a cavity 112 is formed to provide a space into which the diaphragm 120 is bendable due to the acoustic pressure. The cavity 112 is defined by a cavity wall.

In an example embodiment, the cavity 112 may have a cylindrical shape. Further, the cavity 112 may be formed in the vibration area VA to have a shape and a size corresponding to those of the vibration area VA.

The diaphragm 120 may be disposed over the substrate 110. The diaphragm may generate a displacement which may occur due to the acoustic pressure. The diaphragm 120 may have a membrane structure. The diaphragm 120 may cover the cavity 112. The diaphragm 120 may have a lower surface that is exposed through the cavity 112. The diaphragm 120 is bendable in response to applied acoustic pressure, and the diaphragm 120 is spaced apart from the substrate 110.

As shown in FIG. 2, the diaphragm 120 may have a doped portion which is doped with impurities through an ion implantation process. The doped portion may be positioned to correspond to the back plate 140.

In an example embodiment, the diaphragm 120 may have a shape of a circular disc, as shown in FIG. 1.

Referring to FIGS. 1, 2 and 4, the anchor 130 is positioned at an end portion of the diaphragm 120. The anchor 130 is positioned in the supporting area SA of the substrate 110. The anchor 130 supports the diaphragm 120. As shown in FIG. 1, the anchor 130 may extend from a periphery of the diaphragm 120 toward the substrate 110 to space the diaphragm 120 from the substrate 110.

In an example embodiment of the present invention, the anchor 130 may be integrally formed with the diaphragm 120. The anchor 130 may have the lower surface to make contact with the upper surface of the substrate 110.

In an example embodiment of the present invention, the anchor 130 may have a ring shape and may surround the cavity 112, as shown FIG. 1.

The anchor 130 may have a stepped structure to provide improved flexibility.

Referring to FIG. 4, the anchor 130 includes a bottom portion 132 and a first side portion 134. The bottom portion 132 is positioned on the upper surface of the substrate 110. The first side portion 134 extends radially inward from the bottom portion 132 to connect the bottom portion 132 to the diaphragm 120. The first side portion 134 therefore functions as a connecting portion.

The bottom portion 132 maybe in contact with the substrate 110 and may have a ring shape, surrounding the cavity 112 proximate the upper surface of the substrate 110.

The first side portion 134 may extend upwardly from the bottom portion 132. The first side portion 134 may be connected to the diaphragm 120 and provide support to the diaphragm 120. As shown in FIG. 4, the first side portion 134 may be positioned adjacent to the cavity 112. Further, the first side portion 134 may be bent in two steps to have a stepped shape. In other words, the first side portion 134 can present a first riser extending inward and away from the inner diameter of the bottom portion, a first step portion extending inward from the first riser, a second riser extending inward and away from the inner diameter of the first step portion, and a second step portion extending inward from the inner from the second riser to, creating a stepped structure, or stepped cross section.

The first side portion 134 may be positioned at a boundary between the vibration area VA and the supporting area SA. The first side portion 134 may have a ring shape. Further, the first side portion 134 may be disposed adjacent to the doped portion of the diaphragm 120 to surround the doped portion of the diaphragm 120.

The anchor 130 may further include a second side portion 136 opposite the first side portion 134. The second side portion 136 may extend upwardly from the outer diameter of the bottom portion 132 and may surround the first side portion 134.

According to example embodiments, the anchor 130 includes the first side portion 134, which is connected to the diaphragm 120, having a stepped shape that can improve the flexibility of the diaphragm 120. Accordingly, since the MEMS microphone may have a decreased THD value, the MEMS microphone may promote higher quality reproduction of the received acoustic waves. In addition, the diaphragm 120 may have a plurality of vent holes 122. As shown in FIG. 1, the vent holes 122 may be arranged along the anchor 130 in a ring shape and may be radially spaced apart from one another. The vent holes 122 are formed by penetrating through the diaphragm 120 in a vertical direction, and are located about a circle having a diameter smaller than the inner diameter of the anchor 130 (i.e., positions inside of the anchor 130 in a horizontal direction). As shown in FIG. 2, the vent holes 122 are positioned in the supporting area SA. Each of the vent holes 122 may serve as a passage for the applied acoustic wave. Further, each of the vent holes 122 may also function as a passage for the etchant to be used in the process of manufacturing the MEMS microphone 100.

The back plate 140 may be disposed over the diaphragm 120. The back plate 140 may be disposed in the vibration area VA to face the diaphragm 120. The back plate 140 may have a doped portion which is formed by doping impurities through an ion implantation process. The back plate 140 may have an arced shape in embodiments.

In an example embodiment, the MEMS microphone 100 may further include an upper insulation layer 150 and a strut 152 for holding the back plate 140 apart from the substrate 110.

In embodiments, the upper insulation layer 150 is positioned over the substrate 110 over which the back plate 140 is positioned. The upper insulation layer 150 may cover the back plate 140 to hold the back plate 140. Thus, the upper insulation layer 150 may space the back plate 140 from the diaphragm 120.

As shown in FIG. 2, the back plate 140 and the upper insulation layer 150 are spaced apart from the diaphragm 120 to make the diaphragm 120 freely bendable with responding to the acoustic pressure. Further, an air gap AG is formed between the diaphragm 120 and the back plate 140.

The upper insulation layer 150 may have a corresponding portion, which is located over the anchor 130, having a shape similar to that of the anchor 130. That is, since the upper insulation layer 150 is deposited, above a previously formed anchor 130, the corresponding portion of the upper insulation layer 150 may be formed in a shape similar to that of the anchor 130. In particular, as shown in FIG. 2, the corresponding portion of the upper insulation layer 150, which corresponds to the first side portion 134 of the anchor 130, may have a stepped shape similar to that of the first side portion 134 of the anchor 130.

A plurality of acoustic holes 142 may be formed through the back plate 140 such that the acoustic wave may flow or pass through the acoustic holes 142. The acoustic holes 142 may be formed through the upper insulation layer 150 and the back plate 140 to communicate with the air gap AG.

The back plate 140 may include a plurality of dimple holes 144. Further, a plurality of dimples 154 may be positioned in the dimple holes 144. The dimple holes 144 may be formed through the back plate 140. The dimples 154 may be positioned to correspond to positions at which the dimple holes 144 are formed.

The dimples 154 may prevent the diaphragm 120 from being coupled to a lower face of the back plate 140, inhibiting a known issue of conventional MEMS microphones. When acoustic pressure is applied to the diaphragm 120, the diaphragm 120 can be bent in a generally semi-spherical or paraboloid shape toward the back plate 140, and then can return to its initial position. The degree of bending of the diaphragm 120 may vary depending on a magnitude of the applied acoustic pressure and may be increased to such an extent that an upper surface of the diaphragm 120 makes contact with the lower surface of the back plate 140. If the diaphragm 120 is bent so much as to contact the back plate 140, the diaphragm 120 may attach to the back plate 140 and may not return to the initial position. According to example embodiments, the dimples 154 may protrude from the lower surface of the back plate 140 toward the diaphragm 120. Even when the diaphragm 120 is so deformed that the diaphragm 120 contacts the back plate 140, the dimples 154 may keep the diaphragm 120 and the back plate 140 sufficiently separated from each other that the diaphragm 120 is able to return to the initial position.

The strut 152 may be positioned in the supporting area SA and near the boundary between the supporting area SA and the peripheral area OA. The strut 152 may support the upper insulation layer 150 to space the upper insulation layer 150 and the back plate 140 from the diaphragm 120. The strut 152 may extend from a periphery of the upper insulation layer 150 toward the substrate 110. As shown in FIG. 2, the strut 152 may include a lower surface in contact with the lower surface of the substrate 110.

In an example embodiment, the strut 152 may be integrally formed with the upper insulation layer 150. The strut 152 may have a U-shaped vertical section, as shown in FIG. 2.

The strut 152 may be spaced in a radial direction from the diaphragm 120 and may be outwardly positioned away from the anchor 130. The strut 152 may have a ring shape to surround the diaphragm 120, as shown in FIG. 1.

In an example embodiment, the MEMS microphone 100 may further include a lower insulation layer pattern 160, a diaphragm pad 124, a sacrificial layer pattern 170, a back plate pad 146, a first pad electrode 182 and a second pad electrode 184.

In particular, the lower insulation layer pattern 160 may be disposed on the upper surface of the substrate 110 and under the upper insulation layer 150.

The diaphragm pad 124 may be formed on an upper surface of the lower insulation layer pattern 160. The diaphragm pad 124 may be located in the peripheral region OA. The diaphragm pad 124 may be electrically connected to the diaphragm 120 and may be doped with impurities. Though not shown in detail in figures, a connection portion may be doped with impurities to connect the doped portion of the diaphragm 120 to the diaphragm pad 124.

The sacrificial layer pattern 170 may be formed on the lower insulation layer pattern 160 on which the diaphragm pad 124 is formed, and under the upper insulation layer 150. As shown in FIG. 2, the lower insulation layer pattern 160 and the sacrificial layer pattern 170 are located in the peripheral region OA, and are disposed outside of the outer perimeter of the strut 152. Further, the lower insulation layer pattern 160 and the sacrificial layer pattern 170 may be formed using a material different from that of the upper insulation layer 150.

The back plate pad 146 may be formed on an upper face of the sacrificial layer pattern 170. The back plate pad 146 may be located in the peripheral region OA. The back plate pad 146 may be electrically connected to the back plate 140 and may be doped with impurities by an ion implantation process. Though not shown in detail in figures, a connection portion may be doped with impurities to connect the back plate 140 to the back plate pad 146.

The first and second pad electrodes 182 and 184 may be disposed on the upper insulation layer 150 and in the peripheral area OA. The first pad electrode 182 is located over the diaphragm pad 124 to make contact with the diaphragm pad 124. On other hands, the second pad electrode 184 is located over the back plate pad 146 to make contact with the back plate pad 146. As shown in FIG. 2, a first contact hole CH1 is formed by penetrating through the upper insulation layer 150 and the sacrificial layer pattern 170 to expose the diaphragm pad 124, and the first pad electrode 182 makes contact with the diaphragm pad 124 exposed by the first contact hole CH1. Further, a second contact hole CH2 is formed by penetrating through the upper insulation layer 150 to expose the back plate pad 146, and the second pad electrode 184 is formed in the second contact hole CH2 to make contact with the back plate pad 146 exposed by the second contact hole CH2.

As described above, the MEMS microphone 100 according to example embodiments of the present invention includes the anchor 130 having a stepped structure to considerably improve the flexibility of the diaphragm 120 while maintaining a rigidity of the diaphragm 120, as comparing with the conventional MEMS microphone. As a result, the MEMS microphone may have an adjustable THD value while not exceeding an appropriate value to improve a quality thereof.

In addition, embodiments of the present disclosure enable comprise an efficient method of constructing a MEMS microphone. The anchor 130 extends along a circumference of the diaphragm 120 and is provided in a ring shape. Accordingly, in the manufacturing process of the MEMS microphone 100, since the anchor 130 can serve as the passage through which etchant can flow during manufacture. This can result in an improved process margin, as compared with conventional methods. Further, embodiments can inhibit the etchant from remaining on the inner periphery of the anchor 130. As a result, the MEMS microphone 100 can inhibit the buckling phenomenon of the diaphragm caused by residual insulating material in conventional MEMS microphones. This can promote smoother transmission of the applied acoustic pressure. In addition, because the diaphragm 120 includes vent holes 122 that can be provided as a passage for both the acoustic wave and the etchant, embodiments can promote both smooth transmission of the acoustic wave and improved process efficiency.

Hereinafter, a method of manufacturing a MEMS microphone will be described in detail with reference to the drawings.

Figure 5:
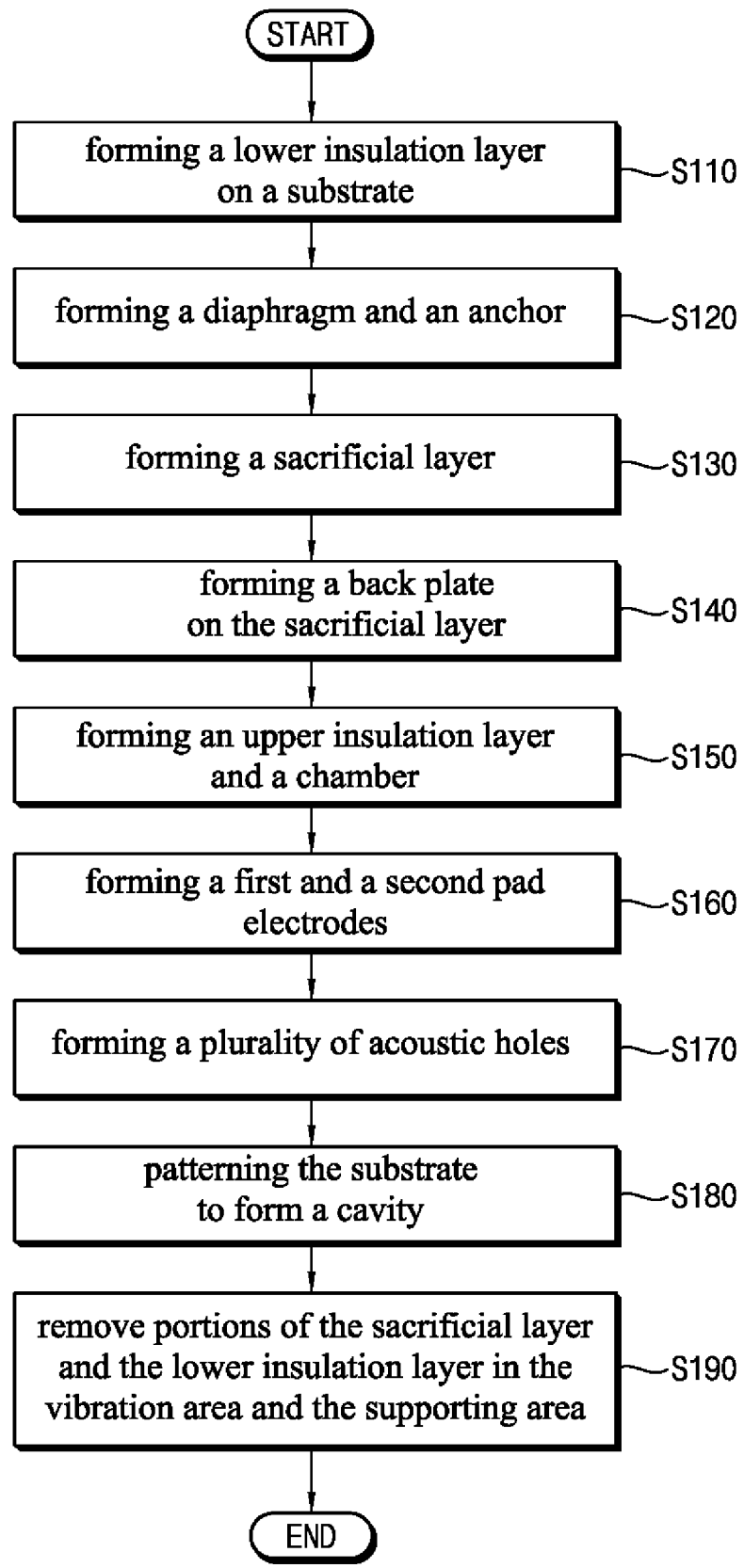
FIG. 5 is a flow chart illustrating a method of manufacturing a MEMS microphone in accordance with an example embodiment of the present invention.

FIG. 5 is a flow chart illustrating a method of manufacturing a MEMS microphone in accordance with an example embodiment of the present invention. FIGS. 6, 8 to 17 are cross sectional views illustrating a method of manufacturing a MEMS microphone in accordance with an example embodiment of the present invention. FIG. 7 is a plan view illustrating the lower insulation layer pattern of FIG. 6.

Referring to FIGS. 5 to 9, according to example embodiments of a method for manufacturing a MEMS microphone, a lower insulation layer 160 is formed on a substrate 110 at S110.

Then, a diaphragm 120 and an anchor 130 are formed on the lower insulation layer 160 at S120.

Hereinafter, the step S120 for forming the diaphragm 120 and the anchor 130 will be in explained in further detail.

Figure 6:
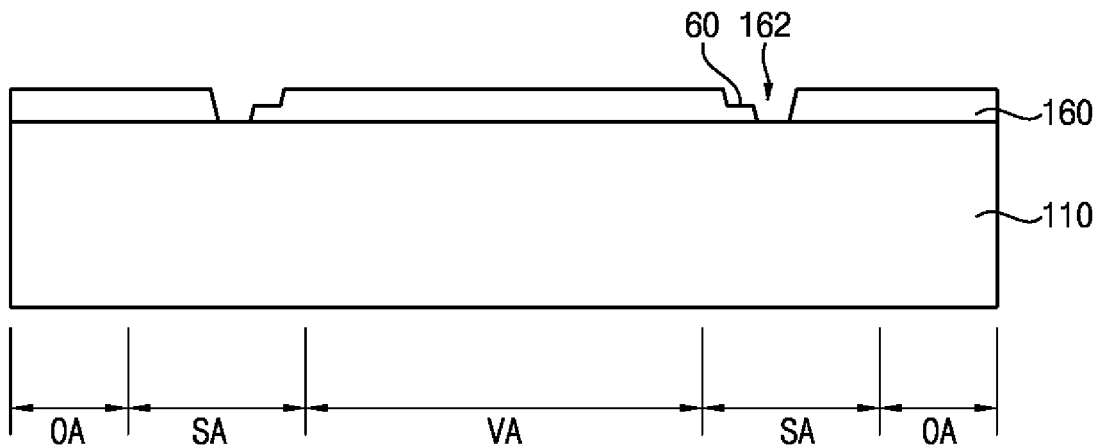
FIGS. 6 and 8 to 17 are cross sectional views illustrating a method of manufacturing a MEMS microphone in accordance with an example embodiment of the present invention.
Figure 7:
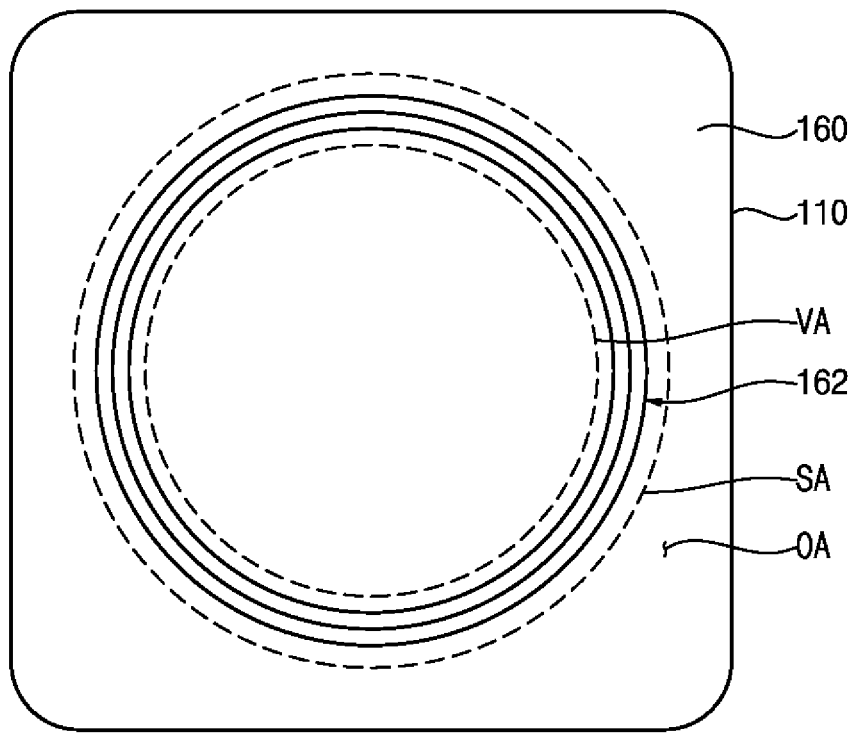
FIG. 7 is a plan view illustrating a lower insulation layer pattern in FIG. 6.

The lower insulation layer 160 is patterned to form an anchor channel 162 for forming the anchor 130, as depicted in FIG. 6. The anchor channel 162 may partially expose the substrate 110. The anchor channel 162 may be formed in the supporting area SA. For example, the anchor channel 162 may be formed to have a ring shape to surround the vibration area VA, as shown in FIG. 7. The anchor channel 162 may be formed to have an inner side face 60 adjacent to the vibration area VA. The anchor channel 162 may have a stepped shape which corresponds to that of the anchor to be formed in a subsequent process.

Figure 8:
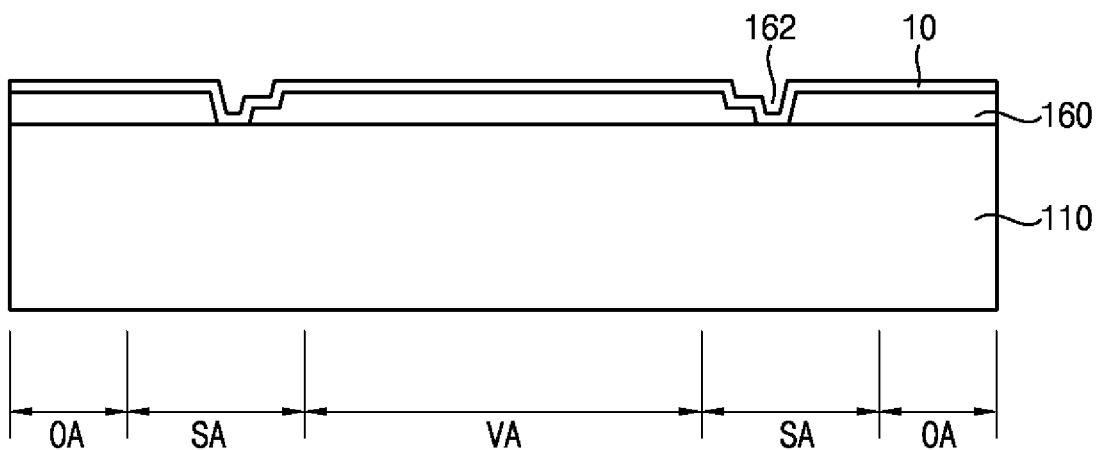

Next, as shown in FIG. 8, a first silicon layer 10 is formed on the lower insulation layer 160. The first silicon layer 10 may be formed using polysilicon.

Impurities may be doped into both a portion of the first silicon layer 10 positioned in the vibration region VA and a portion of the first silicon layer 10 to be subsequently transformed into a diaphragm pad 124 through an ion implantation process.

Figure 9:
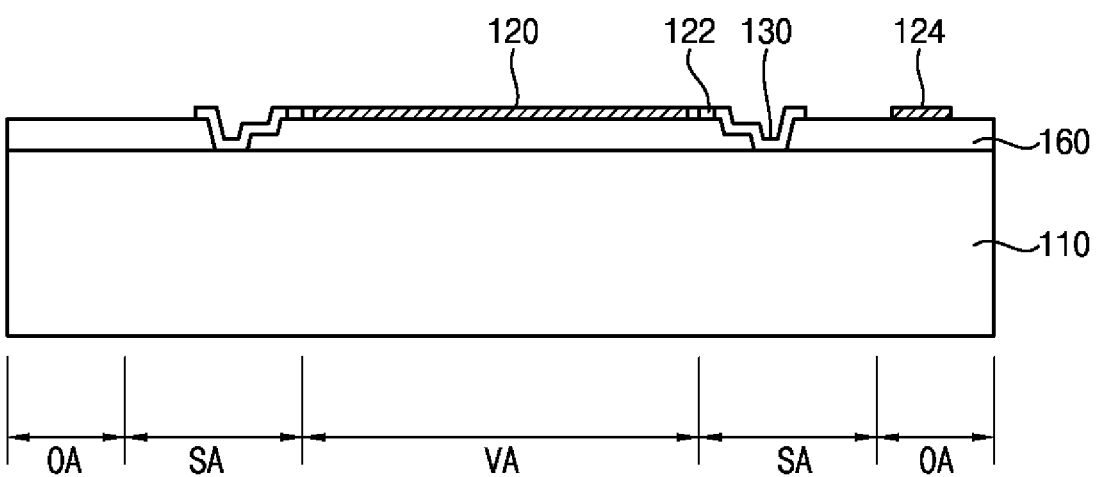

Then, the first silicon layer 10 is patterned to form a diaphragm 120 and the anchor 130, as shown in FIG. 9. Further, the diaphragm pad 124 is formed in the peripheral area OA and a plurality of vent holes 122 may be formed to penetrate through the diaphragm 120 as well.

Figure 10:
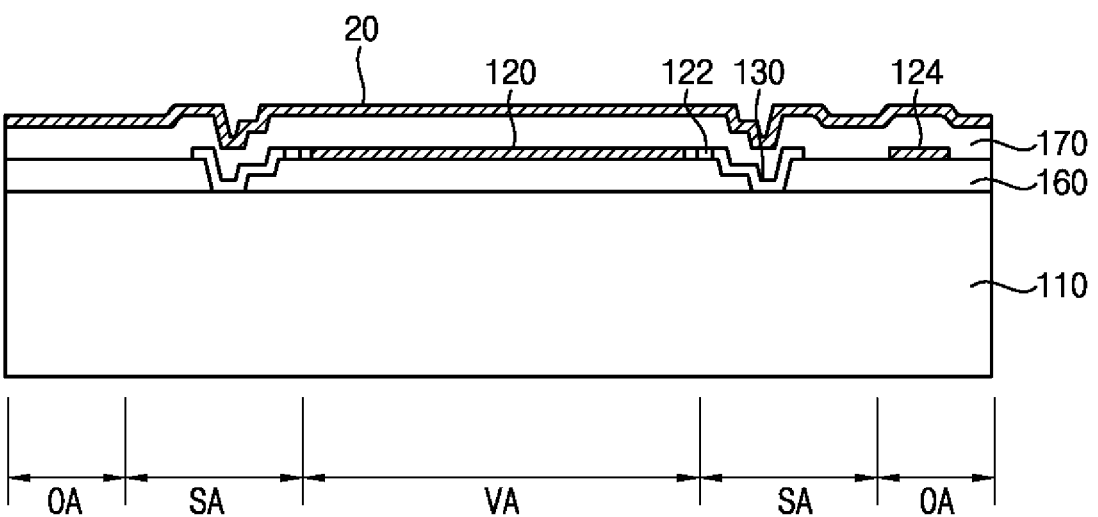

Referring to FIGS. 5 and 10, a sacrificial layer 170 is formed on the lower insulation layer 160 to cover the diaphragm 120 and the diaphragm pad 124 at step S130.

Figure 11:
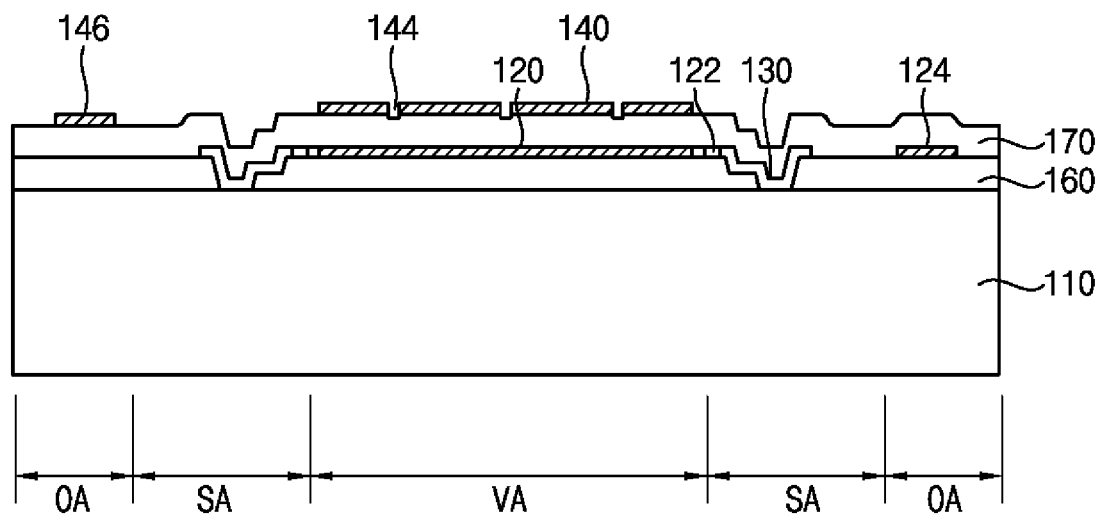

Referring to FIGS. 5 and 11, a back plate 140 is formed on the sacrificial layer 170 at step S140. A second silicon layer 20 is formed on an upper surface of the sacrificial layer 170. Then, impurities are doped with the second silicon layer 20 by an ion implantation process. In an example embodiment, the second silicon layer 20 may be formed using polysilicon.

Next, as shown in FIG. 11, the second silicon layer 20 is patterned to form a back plate 140 and a back plate pad 146. Further, when forming the back plate 140, dimple holes 144 for forming dimples 154 (see FIG. 2) may be further formed, whereas acoustic holes 142 (see FIG. 2) may not be formed. A portion of the sacrificial layer 170 corresponding to the dimple holes 144 may be etched to cause the dimples 154 to protrude downwardly from a lower surface of the back plate 140.

Figure 12:
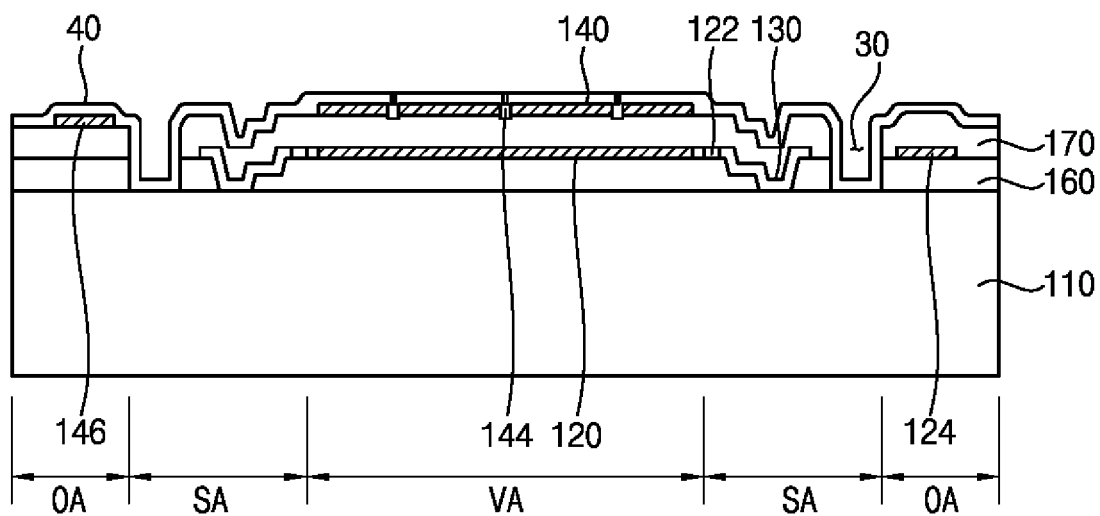
Figure 13:
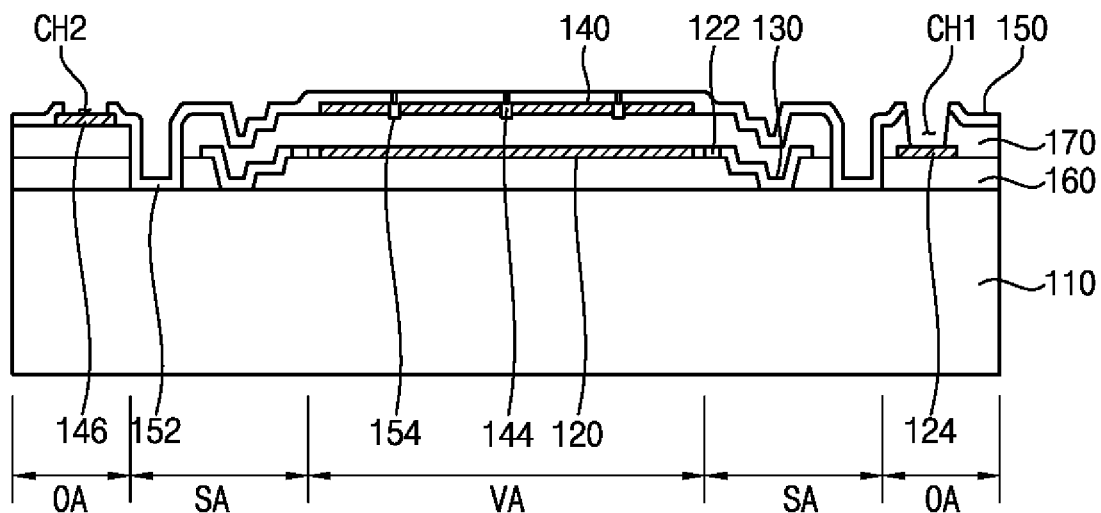

Referring to FIGS. 5, 12 and 13, an upper insulation layer 150 and a strut 152 are formed on the sacrificial layer 170 on which the back plate 140 is formed (step S150).

In particular, the sacrificial layer 170 and the lower insulation layer 160 are patterned to form a strut channel 30 in the supporting area SA for forming a strut 152. The strut channel 30 may partially expose the supporting area SA of the substrate 110. Even though not shown in detail, the strut channel 30 may have a ring shape to surround the diaphragm 120.

After an insulation layer 40 is formed on the sacrificial layer 170 having the strut channel 30, the insulation layer 40 is patterned to form an upper insulation layer 150 and the strut 152, as shown in FIG. 13. Further, the dimples 154 may be further formed in the dimple holes 144 and a second contact hole CH2 is formed to expose the back plate pad 146. Furthermore, both a portion of the insulation layer 40 and a portion of the sacrificial layer 170, positioned over the diaphragm pad 124, are removed to form a first contact hole CH1.

In an example embodiment, the insulation layer 40 may be formed using a material different from those of the lower insulation layer 160 and the sacrificial layer 170. In one example embodiment, the insulation layer 40 is formed using silicon nitride or silicon oxynitride, whereas the lower insulation layer 160 and the sacrificial layer 170 are formed using silicon oxide.

Figure 14:
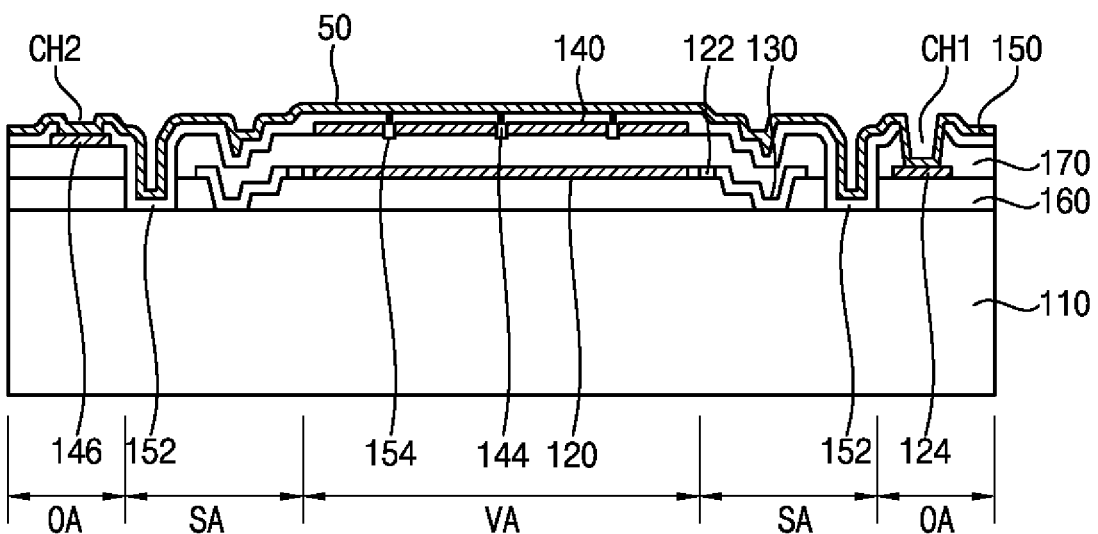
Figure 15:
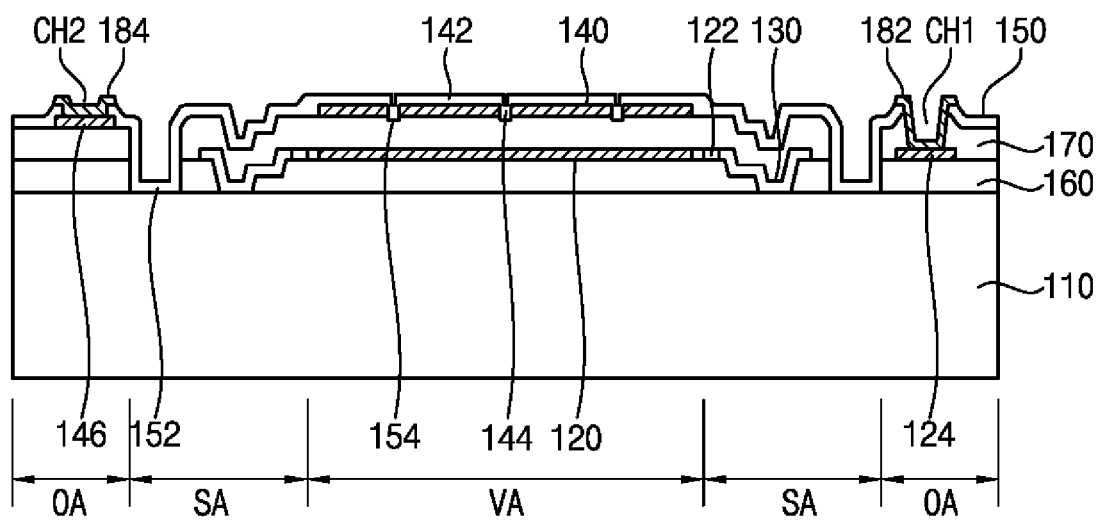

Referring to FIGS. 5, 14 and 15, after forming the first and the second contact holes CH1 and CH2, a first pad electrode 182 and a second pad electrode 184 may be formed at step S160. A thin film 50 is formed on the upper insulation layer 150 through which the first and the second contact holes CH1 and CH2 are formed, as shown in FIG. 14. In an example embodiment, the thin film 50 may be formed using a conductive metal such as aluminum.

Next, the thin film 50 is patterned to form a first pad electrode 182 and a second pad electrode 172, as shown in FIG. 15.

Figure 16:
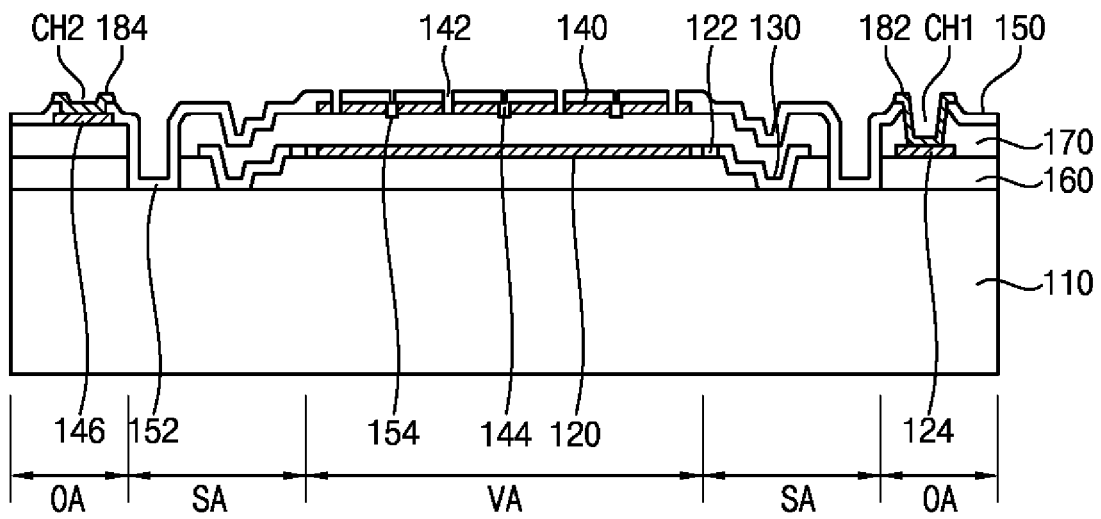

Referring to FIGS. 5 and 16, the upper insulation layer 150 and the back plate 140 are patterned to form acoustic holes 142 in the vibration area VA at step S170.

Figure 17:
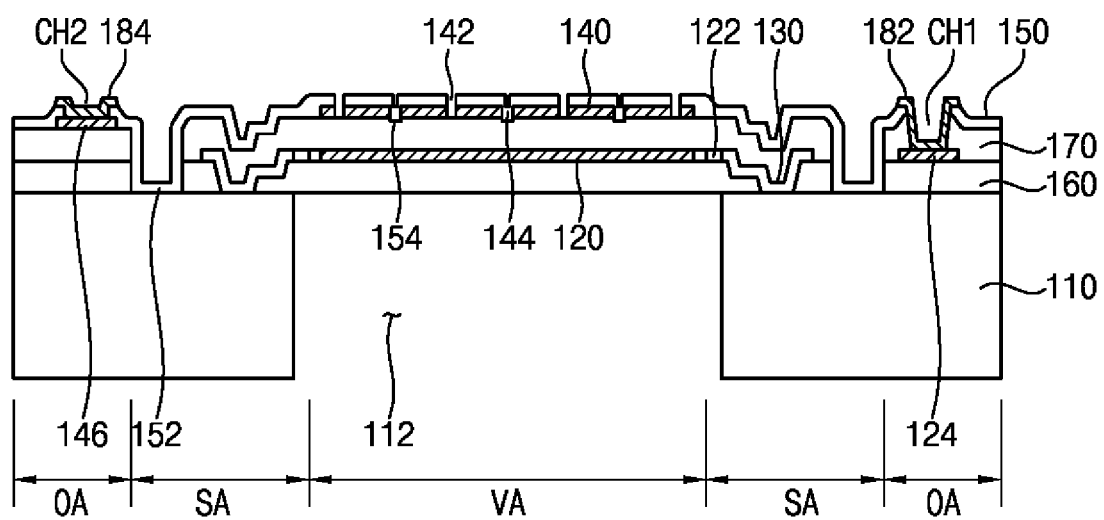

Referring to FIGS. 2, 5, and 17, after forming the acoustic holes 142, the substrate 110 is patterned to form a cavity 112 in the vibration area VA at S180. Thus, a portion of the lower insulation layer 160 is exposed through the cavity 112.

Portions of the sacrificial layer 170 and the lower insulation layer 160, corresponding to the vibration area VA and the supporting area SA are removed through an etching process using the cavity 112 and the acoustic holes 142 at S190. Thus, the diaphragm 120 is exposed through the cavity 112, and an air gap AG is formed. Further, the sacrificial layer pattern and the lower insulation layer pattern are formed. As a result, the MEMS microphone 100 as shown in FIG. 2 is manufactured using the cavity 112, the acoustic holes 142, and the vent holes 122 may also act as passages of etchant for partially removing the lower insulating layer 160 and the sacrificial layer 170.

In addition, the anchor 130 and strut 152 may function to restrict the flow of the etchant during the removal of the sacrificial layer 170 and the lower insulation layer 160 from the vibration region VA and the support region SA. Therefore, an etching amount of the sacrificial layer 170 and the lower insulation layer 160 may be adjusted to prevent the lower insulation layer 160 from remaining inside of the anchor 130.

In an example embodiment of the present invention, a hydrogen fluoride vapor (HF vapor) may be used as the etchant for removing the sacrificial layer 170 and the lower insulation layer 160.

As described above, according to the methods of manufacturing a MEMS microphone of the present invention, the anchor 130 may extend along a periphery of the diaphragm 120 to have a ring shape. Thus, while performing the method of manufacturing the MEMS microphone 100, the anchor 130 may function to restrict a flow area in which etchant flows. As a result, the process margin can be secured and the lower insulation layer 160 may be prevented from remaining inside of the anchor 130. Therefore, the MEMS microphone 100 can prevent the buckling phenomenon of the diaphragm 120, which may occur due to a residual insulation material, and can make the acoustic wave move smoothly. In addition, the process efficiency may be improved.

In addition, since the etchant may be moved through the vent holes 122 of the diaphragm 120 during the manufacturing process of the MEMS microphone, the process efficiency can be improved.

Although the MEM microphone has been described with reference to the specific embodiments, they are not limited thereto. Therefore, it will be readily understood by those skilled in the art that various modifications and changes can be made thereto without departing from the spirit and scope of the appended claims.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112(f) of 35 U.S.C. are not to be invoked unless the specific terms "means for" or "step for" are recited in a claim.

What is claimed is:

1. A Micro-Electro-Mechanical Systems (MEMS) microphone comprising:
    a substrate defining a cavity;
    a back plate disposed over the substrate and defining a plurality of acoustic holes;
    a diaphragm disposed between the substrate and the back plate, the diaphragm being spaced apart from the substrate and the back plate, covering the cavity such that an air gap is maintained between the back plate and the diaphragm, and configured to generate a displacement of the diaphragm in response to an applied acoustic pressure; and
    an anchor extending from an end portion of the diaphragm and extending along a circumference of the diaphragm, the anchor including:
        a bottom portion in contact with an upper surface of the substrate, the bottom portion presenting a ring shape having an inner diameter larger than a diameter of the cavity; and
        a first side portion extending from the inner diameter of the bottom portion to the end portion of the diaphragm, the first side portion including a plurality of stepped portions connected to each other such that the stepped portions define the first side portion.

2. The MEMS microphone of claim 1, wherein the diaphragm defines a plurality of vent holes penetrating therethrough.

3. The MEMS microphone of claim 2, wherein the plurality of vent holes are radially spaced proximate the first side portion of the anchor.

4. The MEMS microphone of claim 2, wherein the vent holes are positioned closer to a center of the diaphragm than the anchor is.

5. The MEMS microphone of claim 1, wherein the anchor further includes:
a second side portion extending from the outer diameter of the bottom portion toward the back plate.

6. The MEMS microphone of claim 1, wherein the first side portion presents a ring shape.

7. The MEMS microphone of claim 1, further comprising:
an upper insulation layer covering the back plate and holding the back plate to space the back plate from the diaphragm such that the air gap is maintained; and
a strut provided at an outer side of the anchor and having a lower surface in contact with the upper surface of the substrate to support the upper insulation layer away from the substrate such that the upper insulation layer is spaced apart from the diaphragm.

8. A MEMS microphone comprising:
a substrate presenting a vibration area, a supporting area surrounding the vibration area and a peripheral area surrounding the supporting area, the substrate defining a cavity formed in the vibration area;
a diaphragm disposed over the substrate to cover the cavity, the diaphragm being spaced apart from the substrate, and being configured to generate a displacement in response to an applied acoustic pressure;
a back plate disposed over the diaphragm and in the vibration area, the back plate being spaced apart from the diaphragm to form an air gap between the diaphragm and defining a plurality of acoustic holes; and
an anchor extending from an end portion of the diaphragm toward the substrate in the supporting area and extending along a circumference of the diaphragm to be configured to support the diaphragm, the anchor having a stepped structure, wherein the anchor includes:
a bottom portion in contact with an upper surface of the substrate, the bottom portion presenting a ring shape having an inner diameter larger than a diameter of the cavity; and
a first side portion extending from the inner diameter of the bottom portion to the end portion of the diaphragm, the first side portion including a plurality of stepped portions connected to each other such that the stepped portions define the first side portion.

9. The MEMS microphone of claim 8, wherein the diaphragm defines a plurality of vent holes penetrating therethrough in the supporting area.

10. The MEMS microphone of claim 8, further comprising:
an upper insulation layer covering the back plate and holding the back plate to space the back plate from the diaphragm such that the air gap is maintained; and
a strut being provided at an outer side of the anchor and having a lower surface making contact with the upper surface of the substrate to support the upper insulation layer away from the substrate such that the upper insulation layer is spaced apart from the diaphragm.

* * * * *